US006670230B2

(12) United States Patent
Hsieh

(10) Patent No.: US 6,670,230 B2
(45) Date of Patent: Dec. 30, 2003

(54) CMOS PROCESS FOR DOUBLE VERTICAL CHANNEL THIN FILM TRANSISTOR

(75) Inventor: In-Cha Hsieh, Hsinchu Hsien (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 10/109,910

(22) Filed: Mar. 29, 2002

(65) Prior Publication Data

US 2003/0064554 A1 Apr. 3, 2003

(30) Foreign Application Priority Data

Oct. 3, 2001 (TW) ......................... 90124400 A

(51) Int. Cl.[7] ........................................ H01L 21/8238
(52) U.S. Cl. ..................... 438/206; 438/137; 438/212
(58) Field of Search ................................ 438/197, 135, 438/149, 137, 138, 136, 206, 207, 212, 680, 681, 682

(56) References Cited

U.S. PATENT DOCUMENTS 5,747,856 A  *  5/1998  Chen et al. ................. 257/390
6,407,431 B2 *  6/2002  Yamazaki et al. .......... 257/353
6,458,633 B1 * 10/2002  Cho ............................ 438/149

* cited by examiner

Primary Examiner—David Nhu
(74) Attorney, Agent, or Firm—Merchant & Gould P.C.

(57) ABSTRACT

A CMOS process for double vertical channel thin film transistor (DVC TFT). This process fabricates a CMOS with a double vertical channel (DVC) structure and defines the channel without an additional mask. The DVC structure of the CMOS side steps the photolithography limitation because the deep-submicrometer channel length is determined by the thickness of gate, thereby decreasing the channel length of the CMOS substantially.

12 Claims, 3 Drawing Sheets

CMOS PROCESS FOR DOUBLE VERTICAL CHANNEL THIN FILM TRANSISTOR

BACKGROUND OF THE INVENTION

1. Field of the Invention

The present invention relates in general to a CMOS (Complementary Metal Oxide Semiconductor) process. In particular, the present invention relates to a CMOS process for double vertical channel thin film transistor (DVC TFT).

2. Description of the Related Art

Conventionally, CMOS circuits are fabricated in crystalline Si substrates to take the advantage of high carrier mobility. However, the circuit speed is often limited by the relatively low effective mobility in a polysilicon MOSFET channel resulting from grain boundary carrier scattering. Even when using hydrogen passivation process as to minimize scattering, the OFF currents are still too high for most applications or the devices degrade after long-term bias stressing.

The most commonly used method to increase the current drive is to increase the channel width. However, leakage current increases with channel width, resulting in a trade off in desired performance. On the other hand, the conventional CMOS process is very complicated and expensive, thereby reducing the steps of the CMOS process is very important.

SUMMARY OF THE INVENTION

The present invention is intended to overcome the above-described disadvantages.

Therefore, the first object of the present invention is to provide a CMOS process for double vertical channel thin film transistor, including the steps of: forming a gate layer on a substrate; forming a first insulator layer on the substrate and the gate layer; forming a semiconductor layer on the first insulator layer, wherein the semiconductor layer has a first area, a second area, and a third area, the third area being formed between the first area and the second area; forming a first mask on the first area, and implanting $N^+$ ions to the second area to define a first doped area and a second channel area, and removing the first mask; forming a second mask on the second area, and implanting $P^+$ ions to the first area to define a second doped area, a first channel area, and an intrinsic area between the first area and second area, and removing the second mask; forming a second insulator layer on the first doped area, the second doped area, the first channel area, the second channel area, and the intrinsic area between the first area and second area; exposing the first doped area and the second doped area at the edges of the first insulator layer; and forming a metal layer on the exposed first doped area and the exposed second doped area.

The second object of the present invention is to provide a CMOS process for double vertical channel thin film transistor, including the steps of: forming a gate layer on a substrate; forming a first insulator layer on the substrate and the gate layer; forming a semiconductor layer on the first insulator layer, wherein the semiconductor layer has a first area, a second area, and a third area, the third area being formed between the first area and the second area; forming a first mask on the first area, and implanting $N^+$ ions to the second area to define a first doped area and a second channel area, and removing the first mask; forming a second mask on the second area, and implanting $P^+$ ions to the first area to define a second doped area, a first channel area, and an intrinsic area between the first area and second area, and removing the second mask; forming a second insulator layer covering over the first channel area and the second channel area; and forming a metal layer on the first doped area, the second doped area, and the intrinsic area.

The third object of the present invention is to provide a CMOS of double vertical channel thin film transistor, including: a gate layer formed on a substrate; a first insulator layer formed on the substrate and the gate layer, wherein the first insulator layer has a flat part and two vertical walls, the flat part being formed between the two vertical walls; a semiconductor layer formed on the first insulator layer, wherein the semiconductor layer has two channels formed on the two vertical walls, and a first doped area and a second doped area formed to connect with the ends of the two channels respectively, and an intrinsic area formed on the flat part between the first doped area and the second doped area; a second insulator layer formed on the semiconductor layer, exposing the sides of the semiconductor layer to form an exposed pattern of the semiconductor layer; and a metal layer formed on the exposed pattern of the semiconductor layer.

The forth object of the present invention is to provide a CMOS of double vertical channel thin film transistor, including: a gate layer formed on a substrate; a first insulator layer formed on the substrate and the gate layer, wherein the first insulator layer has a flat part and two vertical walls, the flat part being formed between the two vertical walls; a semiconductor layer formed on the first insulator layer, wherein the semiconductor layer has two channels formed on the two vertical walls, and a first doped area and a second doped area formed to connect with the ends of the two channels respectively, and an intrinsic area formed on the flat part between the first doped area and the second doped area; a second insulator layer formed and covering over the two channels; and a metal layer formed on the semiconductor layer separately.

The process of the present invention successfully decreases the fabrication cost by simplifying the conventional CMOS process. Furthermore, leakage current is also reduced in the above CMOS with a dual gate and offset structure. Moreover, the double vertical channel (DVC) structure of the above CMOS side steps the photolithography limitation because the deep-submicrometer channel length is determined by the thickness of gate, thereby decreasing the channel length substantially.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Embodiment 1

Figure 1:
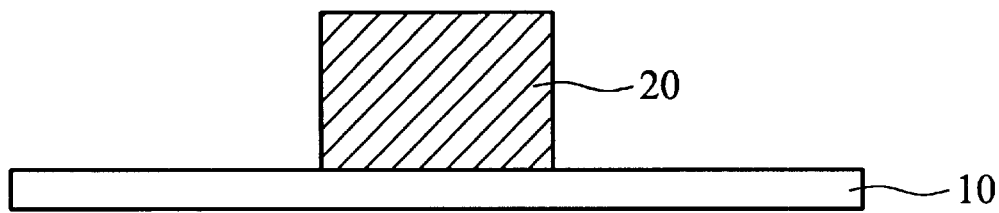
FIGS. 1 to 6 are sectional views showing an embodiment of the CMOS process for double vertical channel thin film transistor according to the present invention.

As shown in FIG. 1, a gate layer 20 is deposited on a substrate 10. The gate layer 20, is preferably deposited by APCVD, LPCVD, PECVD, sputtering system, or e-gun evaporation, and is preferably composed of doped polysilicon, doped amorphous silicon, transition metals, metal silicide, polycide of metal, aluminum, aluminum alloy, or copper.

Figure 2:
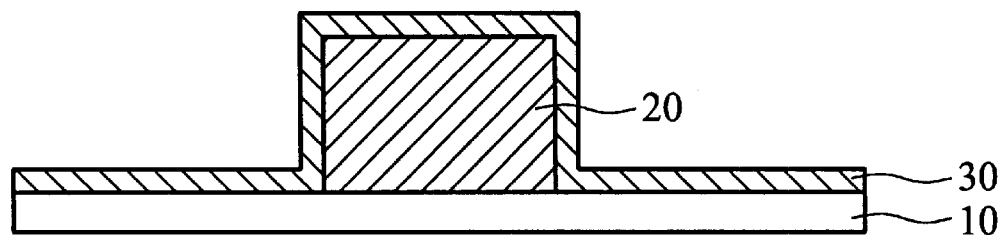

As shown in FIG. 2, a gate insulator layer 30 is deposited on the substrate 10 and the gate layer 20. The gate insulator layer 30, is preferably deposited by APCVD, LPCVD, PECVD, sputtering system, or e-gun evaporation, and is preferably composed of nitride, oxide, or oxynitride.

Figure 3:
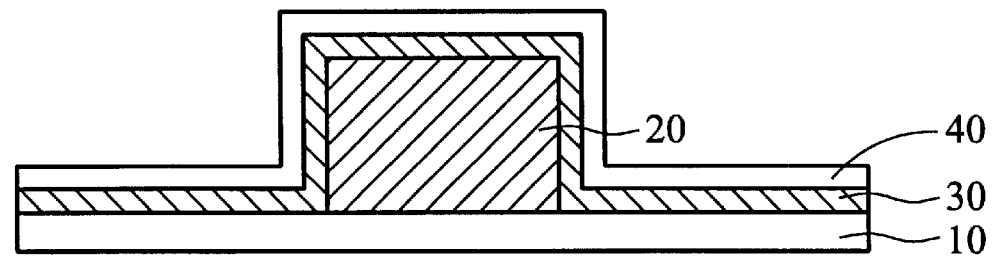

As shown in FIG. 3, a semiconductor layer 40 is deposited on the gate insulator layer 30. The semiconductor layer 40, is preferably deposited by APCVD, LPCVD, PECVD, sputtering system, or e-gun evaporation, and is preferably composed of single crystal silicon, polysilicon, amorphous silicon, or silicon-germaium.

Figure 4:
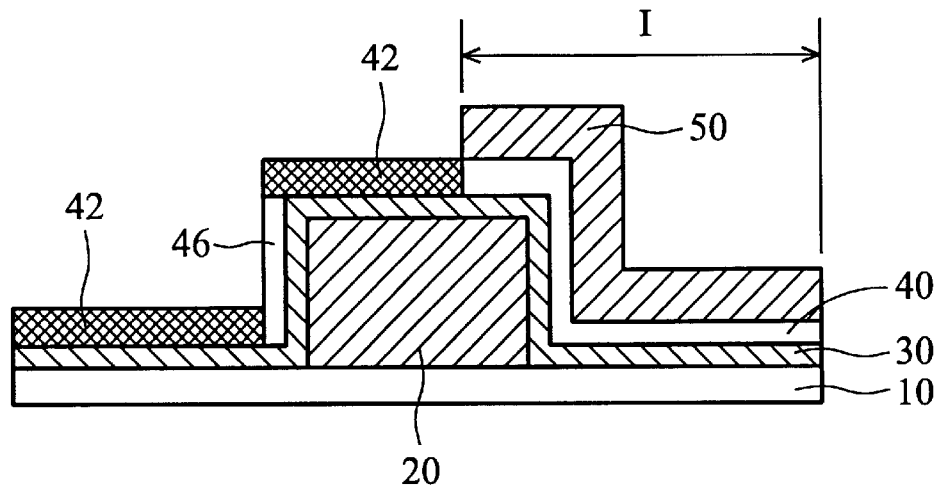
Figure 5:
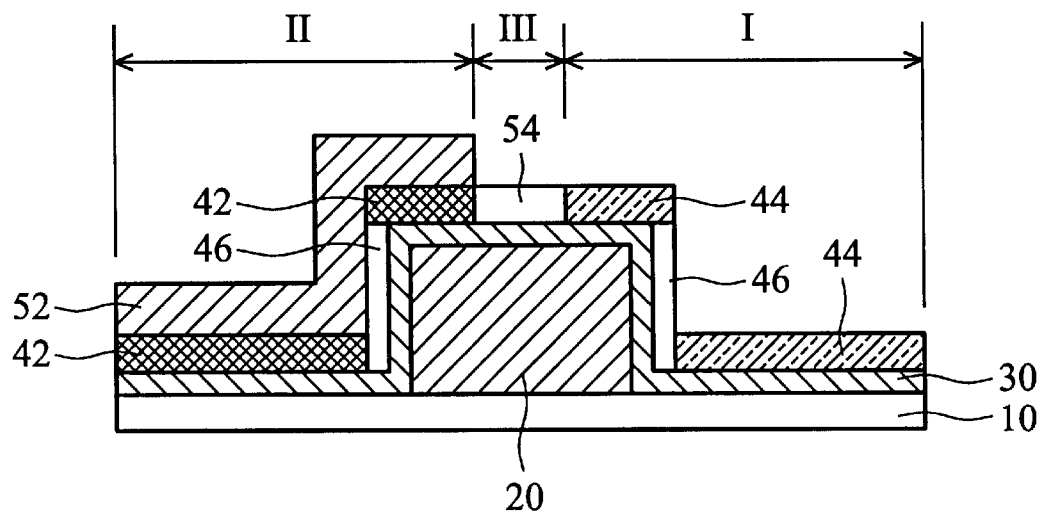

As shown in FIG. 4, a mask 50 is deposited on the surface of I area of the semiconductor layer 40, and $N^+$ ions are implanted to the other surface of the semiconductor layer 40 to define a $N^+$ doped area 42 and a channel 46. Then, the mask 50 is removed. Furthermore, as shown in FIG. 5, a mask 52 is deposited on the surface of II area of the semiconductor layer 40, and $P^+$ ions are implanted to the other surface of the semiconductor layer 40 to define a $P^+$ doped area 44 and a channel 46 of the II area and an intrinsic area 54 of the III area. Then, the mask 52 is removed. In this case, the two channels 46 are called double vertical channel (DVC). The DVC structure side steps the conventional photolithography limitation because the deep-submicrometer channel length is determined by the thickness of gate, thereby decreasing the channel length substantially.

Figure 6A:
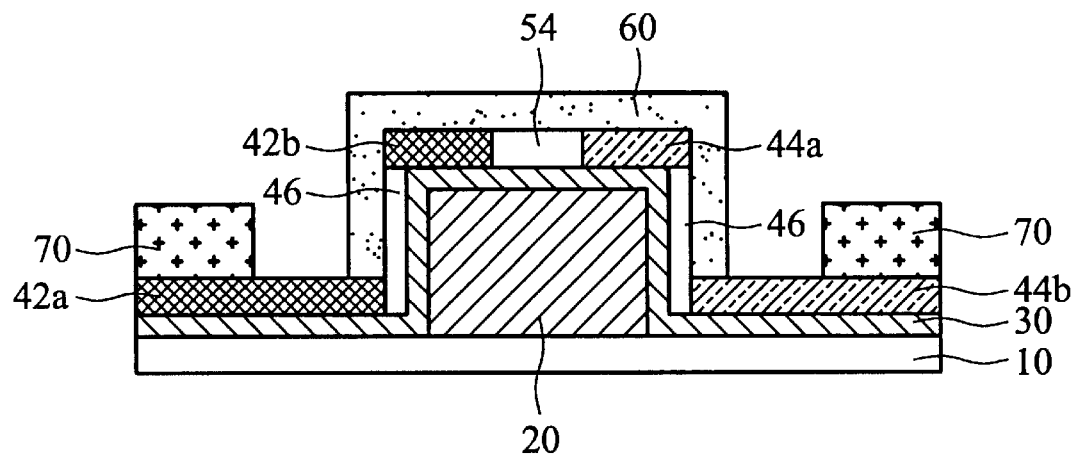

The above $N^+$ doped area 42 and $P^+$ doped area 44, are respectively used as $N^+$ source 42a, $N^+$ drain 42b, $P^+$ source 44a, and $P^+$ drain 44b, as shown in FIG. 6a.

Next, an insulator layer 60 is deposited on the surfaces of $N^+$ drain 42b, the $P^+$ source 44a, channel 46, and the intrinsic area 54, exposing the $N^+$ source 42a and the $P^+$ drain 44b on the edges of the gate insulator layer 30, as shown in FIG. 6a. Lastly, a metal layer 70 is deposited on the above exposed $N^+$ source 42a and the $P^+$ drain 44b. The insulator layer 60, is preferably deposited by APCVD, LPCVD, PECVD, sputtering system, or e-gun evaporation, and is preferably composed of nitride, oxide, or oxynitride. The metal layer 70, is preferably deposited by LPCVD, sputtering system, ore-gun evaporation, and is preferably composed of aluminum, Al—Si alloy, metal silicide, or polycide of metal.

The process of the embodiment 1 successfully simplifies the conventional CMOS process and decreases the fabrication cost.

The CMOS of double vertical channel thin film transistor manufactured according to the process of the first embodiment, includes: a gate layer 20 formed on a substrate 10; a gate insulator layer 30 formed on the substrate 10 and the gate layer 20, wherein the gate insulator layer 30 has a flat part and two vertical walls, the flat part being formed between the two vertical walls; a semiconductor layer 40 formed on the gate insulator layer 30, wherein the semiconductor layer 40 has two channels 46 formed on the two vertical walls, and a first doped area 42 and a second doped area 44 formed to connect with the ends of the two channels 46 respectively, and an intrinsic area 54 formed on the flat part between the first doped area 42 and the second doped area 44; a insulator layer 60 formed on the semiconductor layer 40, exposing the sides of the semiconductor layer 40; and a metal layer 70 formed on the exposed semiconductor layer 40.

As mentioned above, leakage current is reduced by the CMOS of the present invention with a dual gate and offset structure. Moreover, the double vertical channel (DVC) structure of the CMOS side steps the photolithography limitation because the deep-submicrometer channel length is determined by the thickness of gate, thereby decreasing the channel length substantially.

Embodiment 2

In this embodiment, the CMOS process for double vertical channel thin film transistor is similar to the first embodiment except for the formation of the insulator layer and metal layer. In this case, the formation of insulator layer and metal layer are described in detail with reference to FIG. 6b. The other steps of the embodiment 2 are the same as above embodiment 1.

Figure 6B:
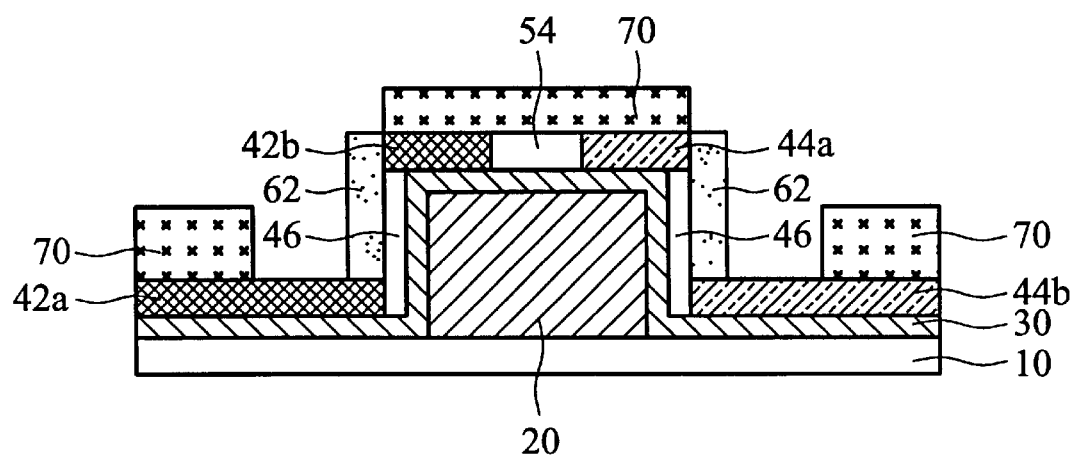

As shown in FIG. 6b, an insulator layer 62 is deposited covering over the two channels 46. The insulator layer 62, is preferably deposited by APCVD, LPCVD, PECVD, sputtering system, or e-gun evaporation, and is preferably composed of nitride, oxide, or oxynitride. Next, a metal layer 70 is deposited on the surfaces of $N^+$ source 42a, $N^+$ drain 42b, intrinsic area 54, $P^+$ source 44a, and $P^+$ drain 44b, as shown in FIG. 6b. The metal layer 70, is preferably deposited by LPCVD, sputtering system, or e-gun evaporation, and is preferably composed of aluminum, Al—Si alloy, metal silicide, or polycide of metal.

The process of the embodiment 2 successfully simplifies the conventional CMOS process and decreases the fabrication cost.

The CMOS of double vertical channel thin film transistor manufactured according to the process of the second embodiment, includes: a gate layer 20 formed on a substrate 10; a gate insulator layer 30 formed on the substrate 10 and the gate layer 20, wherein the gate insulator layer 30 has a flat part and two vertical walls, the flat part being formed between the two vertical walls; a semiconductor layer 40 formed on the gate insulator layer 30, wherein the semiconductor layer 40 has two channels 46 formed on the two vertical walls, and a first doped area 42 and a second doped area 44 formed to connect with the ends of the two channels 46 respectively, and an intrinsic area 54 formed on the flat part between the first doped area and the second doped area; a insulator layer 62 formed and covering over the two channels 46, and a metal layer 70 formed on the semiconductor layer 40 separately.

As mentioned above, leakage current is reduced by the CMOS of the present invention with a dual gate and offset structure. Moreover, the double vertical channel (DVC) structure of the CMOS sidesteps the photolithography limitation because the deep-submicrometer channel length is determined by the thickness of gate, thereby decreasing the channel length substantially.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A CMOS process for double vertical channel thin film transistor, comprising the steps of:

forming a gate layer on a substrate;

forming a first insulator layer on the substrate and the gate layer;

forming a semiconductor layer on the first insulator layer, wherein the semiconductor layer has a first area, a second area, and a third area, the third area being formed between the first area and the second area;

forming a first mask on the first area, and implanting $N^+$ ions to the second area to define a first doped area and a second channel area, and removing the first mask;

forming a second mask on the second area, and implanting P+ ions to the first area to define a second doped area, a first channel area, and an intrinsic area between the first area and second area, and removing the second mask;

forming a second insulator layer on the first doped area, the second doped area, the first channel area, the second channel area, and the intrinsic area;

exposing the first doped area and the second doped area at the edges of the first insulator layer; and forming a metal layer on the exposed first doped area and the exposed second doped area.

2. The CMOS process for double vertical channel thin film transistor as claimed in claim 1, wherein the gate layer comprises doped polysilicon, doped amorphous silicon, transition metals, metal silicide, polycide of metal, aluminum, aluminum alloy, or copper.

3. The CMOS process for double vertical channel thin film transistor as claimed in claim 1, wherein the first insulator layer comprises nitride, oxide, or oxynitride.

4. The CMOS process for double vertical channel thin film transistor as claimed in claim 1, wherein the semiconductor layer comprises single crystal silicon, polysilicon, amorphous silicon, or silicon-germanium.

5. The CMOS process for double vertical channel thin film transistor as claimed in claim 1, wherein the second insulator layer comprises nitride, oxide, and oxynitride.

6. The CMOS process for double vertical channel thin film transistor as claimed in claim 1, wherein the metal layer comprises aluminum, Al-Si alloy, metal silicide, or polycide of metal.

7. A CMOS process for double vertical channel thin film transistor, comprising the steps of:

forming a gate layer on a substrate;

forming a first insulator layer on the substrate and the gate layer;

forming a semiconductor layer on the first insulator layer, wherein the semiconductor layer has a first area, a second area, and a third area, the third area being formed between the first area and the second area;

forming a first mask on the first area, and implanting N ions to the second area to define a first doped area and a second channel area, and removing the first mask;

forming a second mask on the second area, and implanting P+ ions to the first area to define a second doped area, a first channel area, and an intrinsic area between the first area and second area, and removing the second mask;

forming a second insulator layer covering over the first channel area and the second channel area; and forming a metal layer on the first doped area, the second doped area, and the intrinsic area.

8. The CMOS process for double vertical channel thin film transistor as claimed in claim 7, wherein the gate layer comprises doped polysilicon, doped amorphous silicon, transition metals, metal suicide, polycide of metal, aluminum, aluminum alloy, or copper.

9. The CMOS process for double vertical channel thin film transistor as claimed in claim 7, wherein the first insulator layer comprises nitride, oxide, or oxynitride.

10. The CMOS process for double vertical channel thin film transistor as claimed in claim 7, wherein the semiconductor layer comprises single crystal silicon, polysilicon, amorphous silicon, or silicon germaium silicon-germanium.

11. The CMOS process for double vertical channel thin film transistor as claimed in claim 7, wherein the second insulator layer comprises nitride, oxide, or oxynitride.

12. The CMOS process for double vertical channel thin film transistor as claimed in claim 7, wherein the metal layer comprises aluminum, Al-Si alloy, metal suicide, or polycide of metal.

* * * * *